(12) United States Patent
Agarwal et al.

(10) Patent No.: US 7,982,195 B2
(45) Date of Patent: Jul. 19, 2011

(54) CONTROLLED DOSE ION IMPLANTATION

(75) Inventors: Aditya Agarwal, Newburyport, MA (US); Robert D. Rathmell, Murphy, TX (US); David Hoglund, Arlington, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 2317 days.

(21) Appl. No.: 10/940,263

(22) Filed: Sep. 14, 2004

(65) Prior Publication Data

US 2006/0057303 A1  Mar. 16, 2006

(51) Int. Cl.
*G21K 5/10* (2006.01)
(52) U.S. Cl. .................. 250/492.21; 118/729; 427/523
(58) Field of Classification Search .............. 427/523; 118/729; 250/492.21
See application file for complete search history.

(56) References Cited

U.S. PATENT DOCUMENTS

| | | | |
|---|---|---|---|
| 4,293,137 A | | 10/1981 | Ezekiel |
| 4,751,393 A | * | 6/1988 | Corey et al. ............ 250/492.2 |
| 4,761,559 A | | 8/1988 | Myron |
| 4,794,305 A | | 12/1988 | Matsukawa et al. |
| 4,975,586 A | | 12/1990 | Ray |
| 5,003,183 A | * | 3/1991 | Nogami et al. .......... 250/492.2 |
| 5,436,790 A | | 7/1995 | Blake et al. |
| 5,444,597 A | | 8/1995 | Blake et al. |
| 6,222,196 B1 | * | 4/2001 | Mack ................... 250/492.21 |
| 6,750,462 B2 | | 6/2004 | Iwasawa et al. |

FOREIGN PATENT DOCUMENTS

| | | |
|---|---|---|
| EP | 0 559 360 A1 | 9/1993 |
| EP | 1 047 101 A2 | 1/2000 |
| EP | 1 306 879 A2 | 5/2003 |
| GB | 2 386 469 A | 9/2003 |
| WO | WO 2004/001789 A2 | 12/2003 |

OTHER PUBLICATIONS

PCT International Search Report—International No. PCT/US2005/031832 International Filing Date: Aug. 9, 2005; Date of Mailing May 12, 2006 (Three Pages).
Title: Controlled Dose Ion Implantation.

* cited by examiner

*Primary Examiner* — Michael Barr
*Assistant Examiner* — Robert S Walters, Jr.
(74) *Attorney, Agent, or Firm* — Tarolli, Sundheim, Covell & Tummino LLP

(57) ABSTRACT

An ion implanter for creating a ribbon or ribbon-like beam by having a scanning device that produces a side to side scanning of ions emitting by a source to provide a thin beam of ions moving into an implantation chamber. A workpiece support positions a workpiece within the implantation chamber and a drive moves the workpiece support up and down through the thin ribbon beam of ions perpendicular to the plane of the ribbon to achieve controlled beam processing of the workpiece. A control includes a first control output coupled to said scanning device to limit an extent of side to side scanning of the ion beam to less than a maximum amount and thereby limit ion processing of the workpiece to a specified region of the workpiece and a second control output coupled to the drive simultaneously limits an extent of up and down movement of the workpiece to less than a maximum amount and to cause the ion beam to impact a controlled portion of the workpiece.

13 Claims, 8 Drawing Sheets

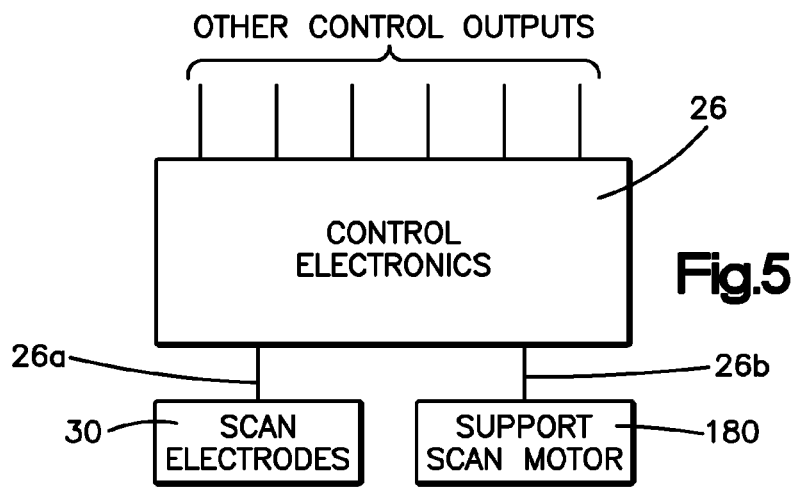
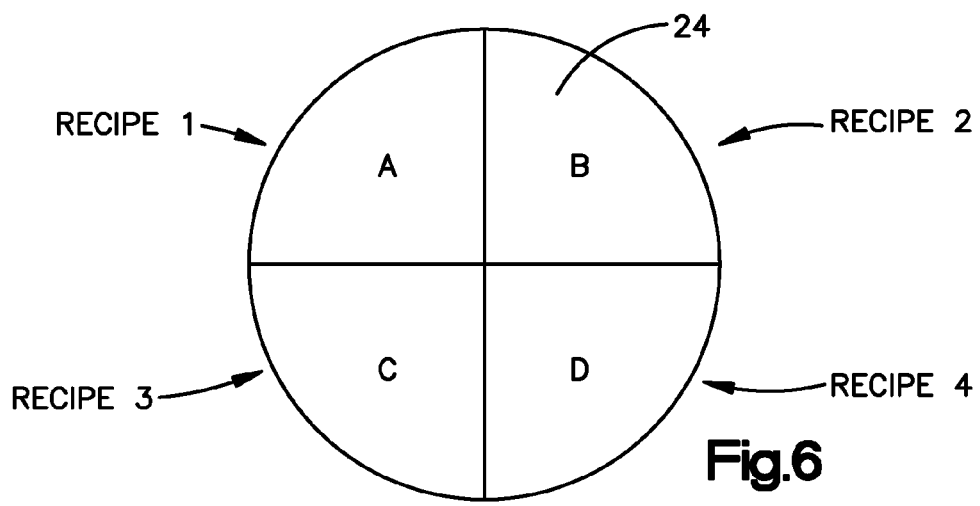
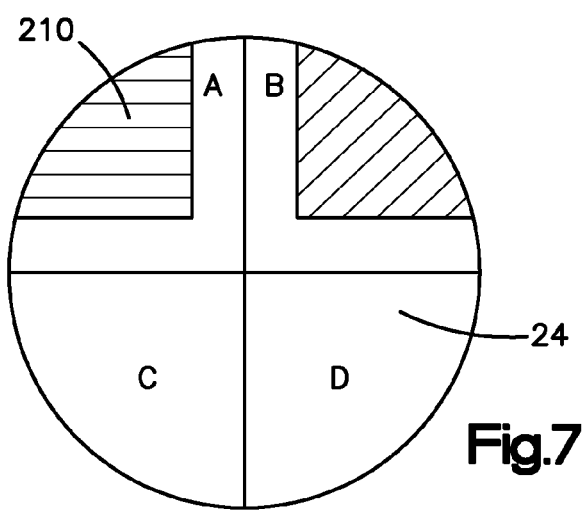

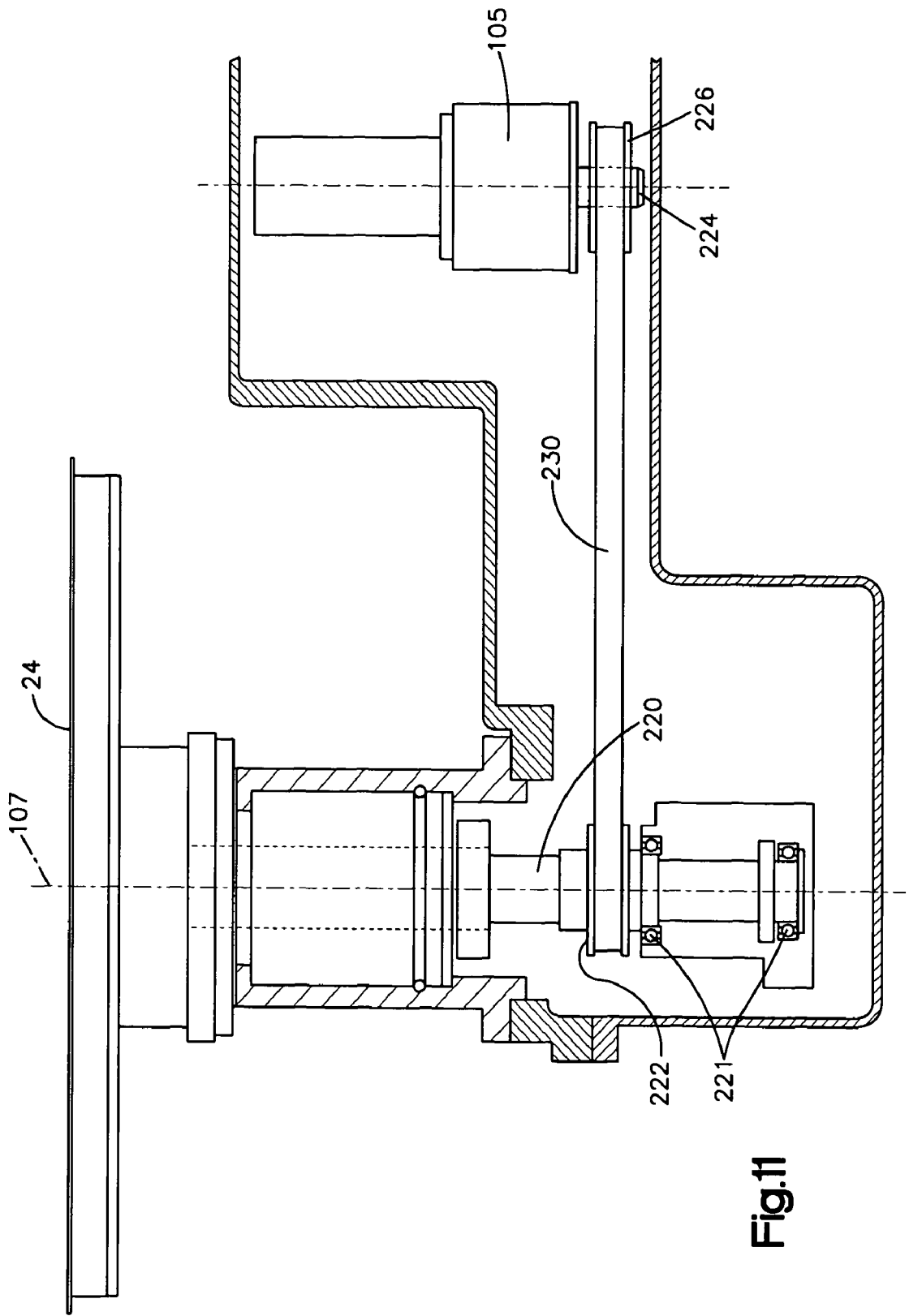

CONTROLLED DOSE ION IMPLANTATION

FIELD OF THE INVENTION

The present invention concerns ion implanters and more particularly concerns serial ion implanters that process workpieces such as semiconductor wafers one at a time.

BACKGROUND ART

Ion implanters of different designs are currently commercially available from a number of sources including Axcelis Technologies, Inc., assignee of the present invention. Two commercially available implanters are sold under the model designations MC3 and 8250. These tools create an ion beam that operates on batches of workpieces or on individual workpieces, one at a time. One typical application of an ion implanter is used to dope a semiconductor wafer with an ion impurity to produce a semiconductor material in the region treated by the ion beam. Although not limited to such wafers the invention has particular utility in such a doping process and the term workpiece and wafer are used interchangeably henceforth in this application.

Single wafer ion implanters currently available for semiconductor device manufacturing are designed for implanting an entire surface of the wafer. It is desirable to be able to implant different regions of the wafer with different implant species or dose or energy to enable a multiple split, split lot device experiment to be conducted on a single wafer. Conducting multiple implants on different regions of the same wafer offers the opportunity to reduce process development costs and also improves control of the experiment since all process steps are carried out on the same wafer.

U.S. Pat. No. 6,750,462 to Iwasawa et al concerns an ion implanting method that both scans an ion beam in an X direction and mechanically drives a substrate in a Y direction. An implanting step is featured for implanting ions separately for two implanted regions with different dose amounts of the substrate is executed plural times by changing at the center of the substrate a driving speed of the substrate.

SUMMARY OF THE INVENTION

The present invention concerns an ion implanter having structure for serially implanting workpieces such as silicon wafers. Serial in this context means implanting one workpiece at a time. One exemplary embodiment of the invention includes a source that is spaced from an implantation chamber by an evacuated region. The source provides ions and in the region between the source and the implantation chamber the ions are accelerated to an appropriate energy for treatment of a workpiece such as a semiconductor wafer.

An exemplary embodiment of an implanter provides a thin ribbon beam of ions that enter the implantation chamber. A workpiece support positions a workpiece within the implantation chamber and a drive moves the workpiece support back and forth through the thin beam of ions to perform controlled beam processing of the workpiece.

A control provides a first control output coupled to limit an extent of the ribbon beam to less than a maximum amount and thereby limit ion processing of the workpiece to a specified region of the workpiece. The control provides a second control output coupled to the drive to control back and forth movement of the workpiece support. This results in the ion beam impacting a controlled portion of the workpiece.

A typical control will include a programmable controller and an ability to program different recipes into the control. This flexibility allows, for example, non uniform ion implantation as a means of evaluating implanter performance.

These and other aspects and features of the invention are described in greater detail in conjunction with the accompanying drawings.

BRIEF DESCRIPTION OF THE DRAWINGS

FIG. 5 is a block diagram of control electronics for use with the ion implanter of FIG. 1;

FIG. 6 is a schematic depiction of a wafer workpiece divided into quadrants with different dose recipes applied to different quadrants;

FIG. 7 is a schematic depiction of a wafer workpiece with ion beam scanning over two different sub portions or sub regions of the wafer workpiece.

FIG. 11 is a schematic depiction of a system for applying a twist angle to a wafer workpiece mounted to a chuck within an implantation chamber.

EXEMPLARY ALTERNATE EMBODIMENTS OF THE INVENTION

Figure 1:
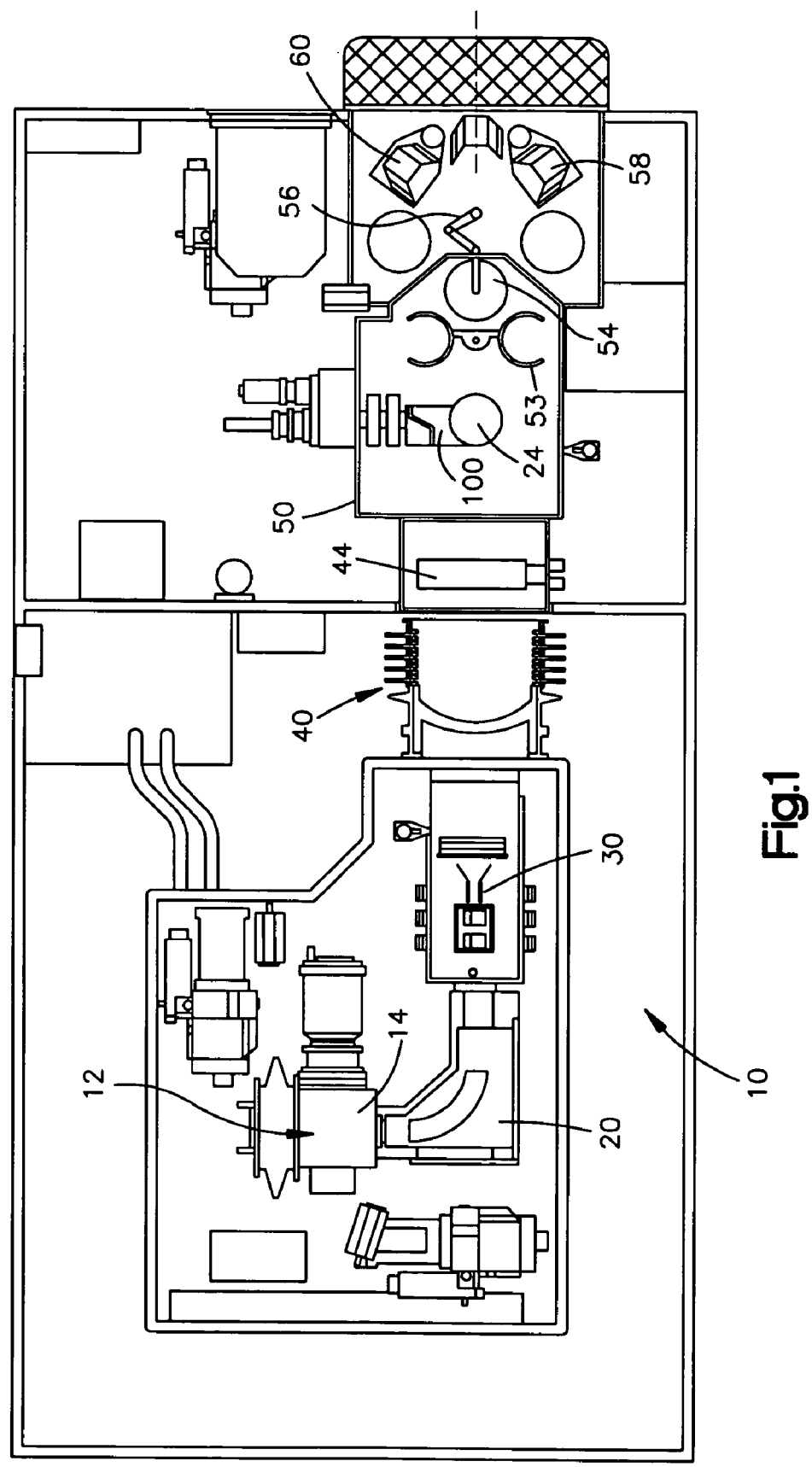
FIG. 1 is an overview schematic of an ion implanter constructed in accordance with the invention.

FIG. 1 is a schematic depiction of an ion implanter 10 such as Axcelis model MC-3 medium current ion implanter sold by the assignee of the present invention. Such an implanter is used for ion beam treatment of work-pieces such as silicon wafers for selective doping of those wafers. In such an implanter positive ions strike the work-piece after traversing a beam path from a source to an implanter station. Although the ion implanter 10 depicted in FIG. 1 is a medium current ion implanter other types of implanters including high energy implanters having a linac for accelerating ions are also within the scope of the invention.

The exemplary ion implanter 10 includes an ion source 12 for emitting ions generated from a source material. Typical source materials are either gases injected into a source housing 14 or solids that are vaporized to produce a plasma of ions within the source housing. As is well known in the prior art such a source 12 typically includes an extraction electrode for causing ions to exit the housing 14 along a beam path away from the source.

The implanter 10 depicted in FIG. 1 also includes a mass discriminating magnet 20 for bending ions away from an initial trajectory along a path of ion travel downstream from the ion source. Different species of the same ion are produced in the source 12 and the magnet discriminates between theses species. Ions of an undesirable mass are filtered by the magnet so that ions exiting the mass analyzing magnet 20 are of a single species of the ion used in beam treatment of a workpiece.

The ion implanter 10 also includes a beam scanning structure 30 which is positioned to intercept ions subsequent to the mass discriminating magnet 20 and scan ions from side to side in a controlled manner to form a ribbon like ion beam having a width. In one known design the scanning structure uses an electrostatic field that is created between two scan plates that are approximately 15 cm long and spaced apart by 5 cm. This separation expands outwardly to a separation of about 7.5 cm at an exit end of the two scanning electrodes. Time varying voltages of up to +/−5 kilovolts of a controlled magnitude are applied to suitable amplifiers coupled to each plate to achieve a total plate voltage separation of 10 kv. Suitable sawtooth waveforms are applied by control electronics 26 (FIG. 5) to sweep the ions from side to side at a controlled frequency. Alternate means of creating a ribbom beam are use of time varying magnetic fields and use of structure that defines the beam exiting the source prior to species discrimination.

Returning to the exemplary structure shown in FIG. 1, the system includes lens structures 40 that accept ions moving along diverging paths from the scanning structure 30 and bends them as they are accelerated across a gap between curved electrodes to create substantially parallel ion trajectories for ions leaving the lens structures 40. Subsequent to leaving the lens structures 40, the ions that make up the beam are moving in generally parallel directions and form a thin ribbon or ribbon-like beam 42. (See FIG. 2) The beam 42 passes through an energy filter 44 which deflects ions downward due to their charge. This downward deflection removes neutral particles that have entered the beam during the upstream beam shaping before entering the filter 44.

A wafer 24 is moveably supported within an ion implantation chamber 50 by a workpiece support structure 100. Workpieces 24 (typically wafers) are inserted into the chamber 50 by means of a load lock 54 and moved to a wafer clamp 102 by an in vacuum robot 53. Outside the chamber 50 the wafers are manipulated by a robot 56 which extracts untreated wafers from a storage cassette 58 and returns treated wafers to a second cassette 60 or alternatively can return the treated wafers from the same cassette from which they were withdrawn.

Generally, the extent of the ribbon ion beam 42 is sufficient to implant an entire implantation surface of the workpiece 24. That is, if the workpiece 24 has a diameter of 300 mm, control electronics 26 will appropriately energize the scanning electrodes 30 such that a horizontal extent or width, W (FIG. 2) of the ribbon ion beam 42 entering the implantation chamber will be at least 300 mm. As described below, the extent of the beam 42 is selectively limited to a narrower dimension for specialized implant control.

As will be explained below, the workpiece support assembly 100 both supports and moves the workpiece 24 with respect to the ribbon ion beam 42 during implantation such that a desired implantation surface of the workpiece 24 is controllably implanted with ions. As mentioned previously, in addition to the scanning technique described above, those of skill in the art will recognize that the ribbon shape of the ribbon ion beam 42 within the implantation chamber 50 can be created in a number of alternate ways.

A more detailed description of a prior art ion implanter adapted for serial implantation of workpieces is disclosed in U.S. Pat. No. 4,975,586, issued to Ray. et al. on Dec. 4, 1990 and U.S. Pat. No. 4,761,559, issued to Myron on Aug. 2, 1988. The '586 and '599 patents are assigned to the assignee of the present invention and are incorporated herein in their respective entireties by reference. The structure of these patents can achieve the scan patterns contained in FIGS. 12A-12D of the '462 prior art patent to Iwasawa et al.

Figure 10:
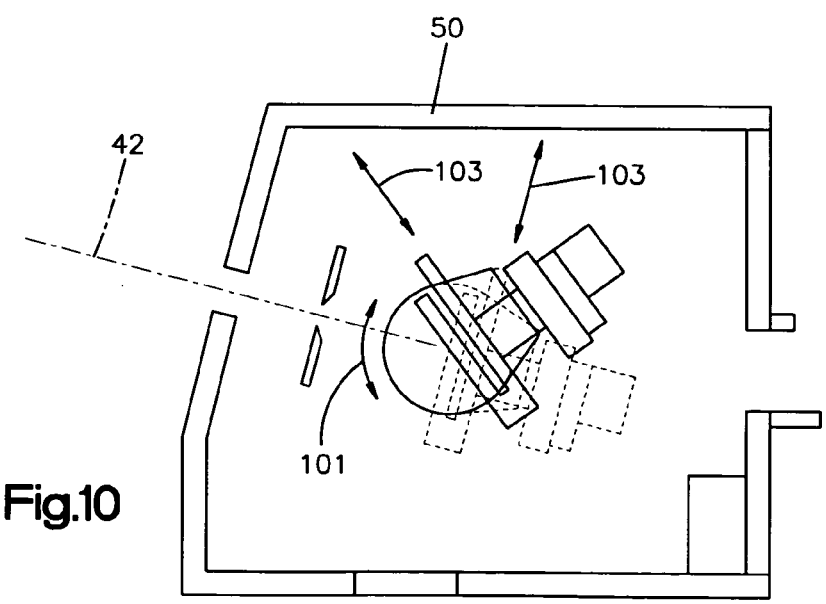
FIG. 10 schematically depicts different tilt angles and use of different back and forth scan directions with those tilt angles.

Prior to implantation, the workpiece support assembly 100 rotates the workpiece 24 from the horizontal orientation it assumes after transfer from the robot 53, to a vertical or near vertical position for implantation. If the workpiece 24 is vertical, that is, normal with respect to the ion beam 42, the implantation angle or angle of incidence is 0 degrees. It has been found that to minimize undesirable channeling effects, typically, a small but nonzero implantation angle is selected. As seen in FIG. 10, the workpiece can be rotated as indicated by the arrow 101 through different angles. One characteristic of the structure shown in the drawings is an ability to scan along a linear path (indicated by the arrows 103 in FIG. 10) so that a distance the ion beam 42 travels through the implantation chamber 50 before striking the workpiece is approximately the same for all regions of the workpiece.

The support assembly 100 also optionally may include structure including a motor 105 (FIG. 11) which is able to rotate the workpiece through approximately 360 degrees about an axis 107 passing through the center of the workpiece normal to the wafer support. This allows the control electronics 26 to apply a specified amount of twist to the workpiece to re-orient the wafer. The structure for applying such a twist is described in greater detail below in conjunction with the FIG. 11 depiction.

A single wafer is placed into the load lock 54 and the implantation chamber is pumped down to a desired vacuum. Within the implantation chamber a robot 53 grasps the workpiece 24, brings it within the implantation chamber 50 and places it on an electrostatic clamp or chuck 102 of the workpiece support structure 100. The electrostatic clamp 102 is energized to hold the workpiece 24 in place as it is re-oriented inside the chamber 50. Suitable electrostatic clamps are disclosed in U.S. Pat. No. 5,436,790, issued to Blake et al. on Jul. 25, 1995 and U.S. Pat. No. 5,444,597, issued to Blake et al. on Aug. 22, 1995, both of which are assigned to the assignee of the present invention. Both the '790 and '597 patents are incorporated herein in their respective entireties by reference. After ion implantation of the workpiece 24, the workpiece support structure 100 returns the workpiece 24 to a horizontal position and the electrostatic clamp 102 is de-energized to release the workpiece for removal by the in vacuum robot 53 back through the load lock 54.

The workpiece support structure 100 is operated by the control electronics 26. (FIG. 5) The workpiece support structure 100 supports the workpiece 24 during implantation while providing both rotational (tilt and twist) and translational movement of the workpiece 24 with respect to the ribbon ion beam within the implantation chamber 22. By virtue of its rotational capability, the workpiece support structure 100 advantageously permits selection of a desired implantation angle or angle of incidence between the ion beam and the implantation surface of the workpiece.

By virtue of its translational or linear movement capability, the workpiece support structure 100 permits the implantation surface of the workpiece 24 to be moved within a plane fixed with respect to the desired implantation angle during implantation thereby both maintaining the desired implantation angle and additionally maintaining a distance that the ribbon ion beam travels from its entry into the interior of the implantation chamber 50 to the region where it impacts the implantation surface of the workpiece. Additional details concerning the wafer support structure are contained in issued U.S. Pat. No. 6,740,894 which is assigned to Axcelis Technologies and is incorporated in its entirety herein by reference.

During implantation of the workpiece 24, the workpiece support structure 100 moves the workpiece 24 in a direction transverse to the ribbon ion beam 42 such that an entire implantation surface is appropriately impacted and implanted with desired ions. As can be seen in the schematic depiction in FIG. 2, the ribbon ion beam 42 at a point of impact with the workpiece 24 has a maximum width W in the "x" direction (FIG. 2) which is greater than the diameter of the workpiece 24, thus, no translation of the workpiece in the "x" direction is required for full implantation of the workpiece.

Figure 2:
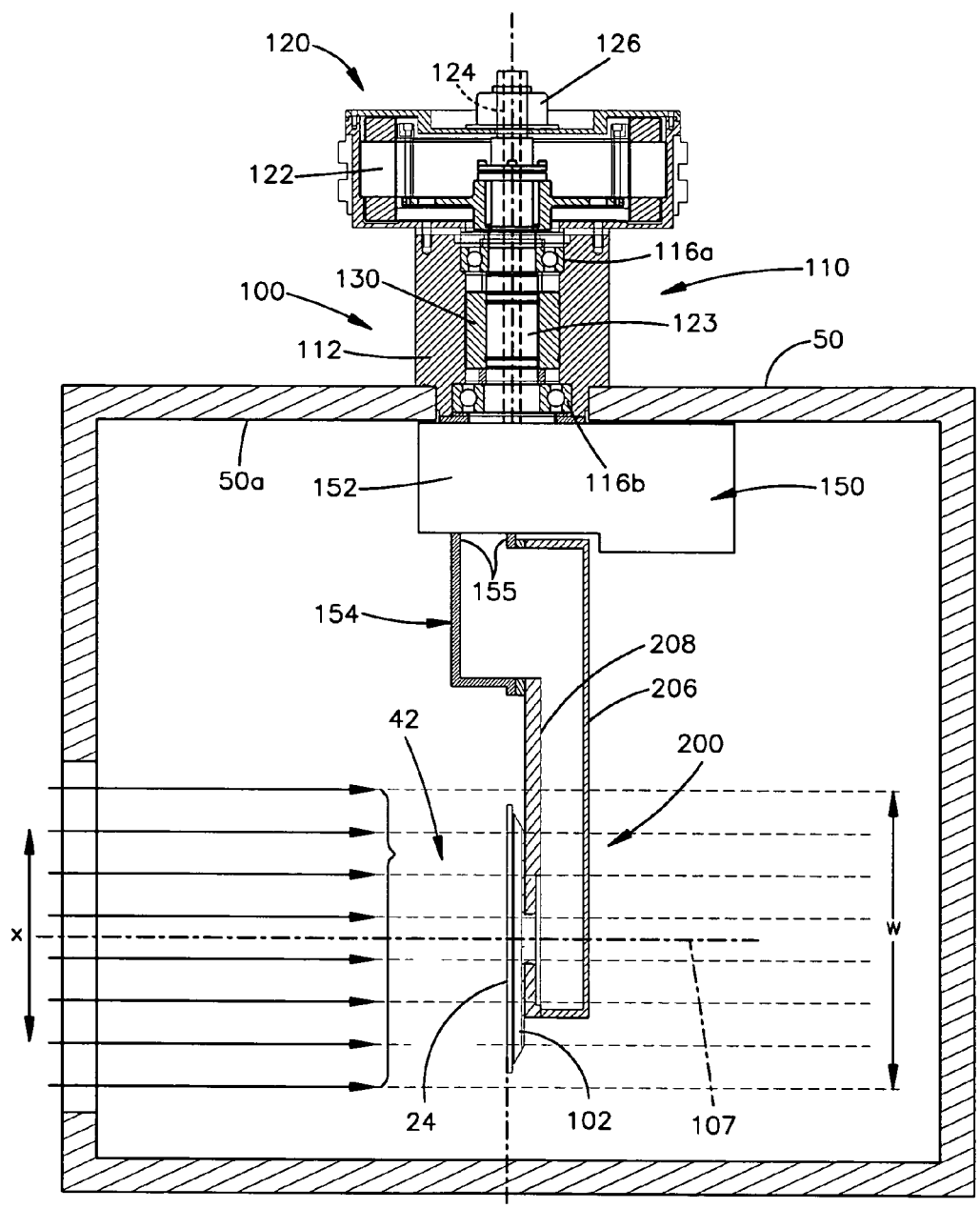
FIGS. 2 and 3 are plan and front elevation views of an implantion chamber illustrating postioning of a workpiece support within the implantation chamber.
Figure 3:
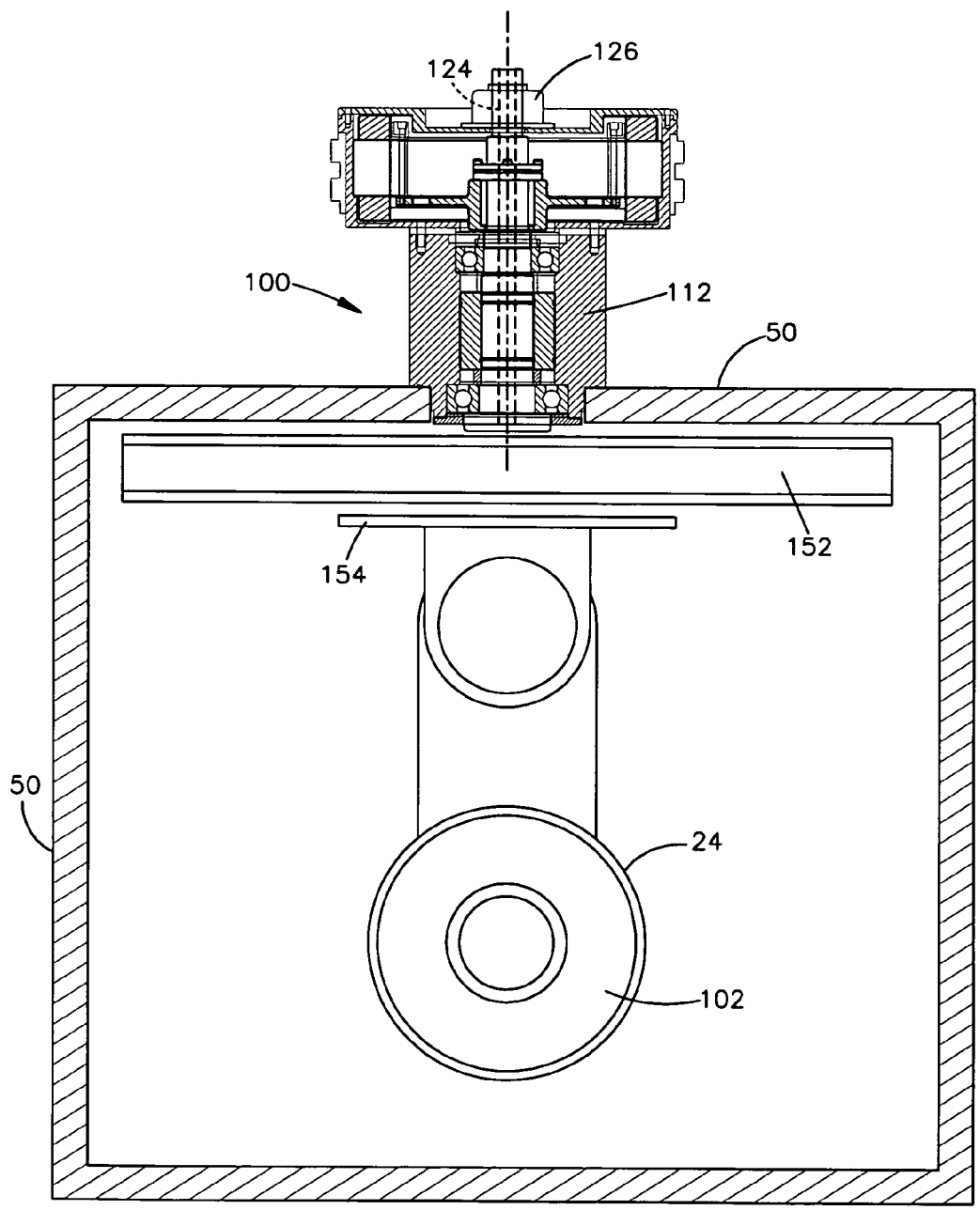

As can best be seen in FIGS. 2 and 3, the workpiece support structure 100 is affixed to a side wall 50a of the implantation chamber 50. The workpiece support structure 100 includes a rotation member 110 to control implant angle (tilt) and an integral translation member 150. The workpiece support structure rotation member 110 comprises a rotary turntable assembly affixed to the implantation chamber 50. In one preferred embodiment, the rotation member 110 includes a spindle bearing support housing 112 affixed to the implantation chamber and a rotary drive mechanism 120 rotatably affixed to the support housing 112. The support housing 112 is affixed to the implantation chamber and, preferably, to the implantation chamber side wall 50a and extends into the opening of the implantation chamber side wall.

The rotation member 110 includes a spindle bearing system disposed in the support housing 112 and a hollow tilt axis shaft 123 rotatably supported by the spindle bearing systems. As can be seen in FIG. 2, the tilt axis shaft 123 extends into the implantation chamber interior region. The rotation member 110 also includes a ferrofluidic rotary vacuum seal system 130 also disposed between spaced apart sets of bearings 116a, 116b of the spindle bearing system.

The rotary drive mechanism 120 includes a rotational servomotor 122 which, in response to control signals from the control electronics 26, precisely rotates the tilt axis shaft 123 and, thereby, rotates the workpiece 24 to the desired implantation angle. The angular position of the shaft 123 is monitored and reported to the control electronics 26 by a suitable rotary encoder 126. The servo-motor 122 is of conventional design and may, for example, be a direct drive servomotor or a gear-reduced servomotor. A central opening or bore 124 extends through the tilt axis shaft 123 to permit facilities, such as electrical wiring, to be routed to the translation member 150. The central bore 124 is at atmospheric pressure, unlike the evacuated implantation chamber interior region.

The tilt axis shaft 123 is rotatably supported within the support housing 112 by means of the bearing assembly which includes two spaced apart bearings 116a, 116b, each of which comprises a conventional mechanical bearing assembly such as ball or roller bearings supported within a bearing cage and disposed between and inner and outer races.

Alternately, the bearing assembly 116 may be a different type of bearing assembly such as, for example, a non-contact gas bearing assembly or other type of bearing assembly as would be recognized by one of skill in the art.

A ferrofluidic seal of the magnetic fluid seal system 130 provides a hermetic seal under both static and dynamic conditions against gas, vapor and other contaminants from entering the implantation chamber 50. Further, since the sealing medium is a fluid, there is a low friction between the rotatable shaft 123 and the stationary portions of the seal system 130. Suitable hollow shaft cartridge mount vacuum feedthroughs and hollow shaft flange mount vacuum feedthroughs for the magnetic fluid seal system 130 are commercially available from Ferrotec (USA) Corporation, 40 Simon Street, Nashua, N.H. 03060-3075 (web site: http://www.fero.com/usa/sealing). A magnetic fluid seal system is disclosed in U.S. Pat. No. 4,293,137, issued Oct. 6, 1981 to Ezekiel. The '137 patent is incorporated in its entirety herein by reference.

The workpiece support structure 100 further includes the translation or reciprocating member 150 which is disposed within an interior region of the implantation chamber. As can best be seen in FIG. 4, the translation member 150 includes a support frame 152 that attaches to the rotatable tilt axis shaft 123 and a carriage 154 mechanically coupled to the support frame 152 via a linear bearing assembly 160 for linear movement with respect to the support frame 152. The translation member 150 provides for linear translational movement of the workpiece 24 along a plane coincident with the selected implantation angle.

As can best be seen in FIG. 2, the carriage 154 includes two flanges 155 that support the workpiece holder assembly 200. The workpiece holder assembly 200 includes a support arm 206, attached at one end to the carriage 154. At its opposite end, the support arm 206 supports a workpiece holder 208 of the workpiece holder assembly 200. The workpiece holder 208 supports the electrostatic clamp 102 which, in turn, supports the workpiece 24 for movement through the ribbon ion beam 42.

Returning to FIG. 4, the carriage 154 is supported for linear movement with respect to the support frame 152 by means of the linear bearing assembly 160. The bearing assembly 160 preferably includes a pair of spaced apart, parallel linear rail supports 162, 164 affixed to an outward face 166 of the stationary support 152 and four bearing ways 168, 170, 172, 174 (FIG. 4) affixed to an inward face 176 of the carriage 154. A plurality of ball or roller bearings are disposed in each of the four bearing ways 168, 170, 172, 174. The bearings of the two spaced apart ways 168, 170 bear against and roll along the rail support 162 and the bearings of the two spaced apart ways 172, 174 bear against and roll along the rail support 164 to provide for linear movement of the carriage 154 with respect to the stationary support 152 and the implantation chamber 50.

Figure 4:
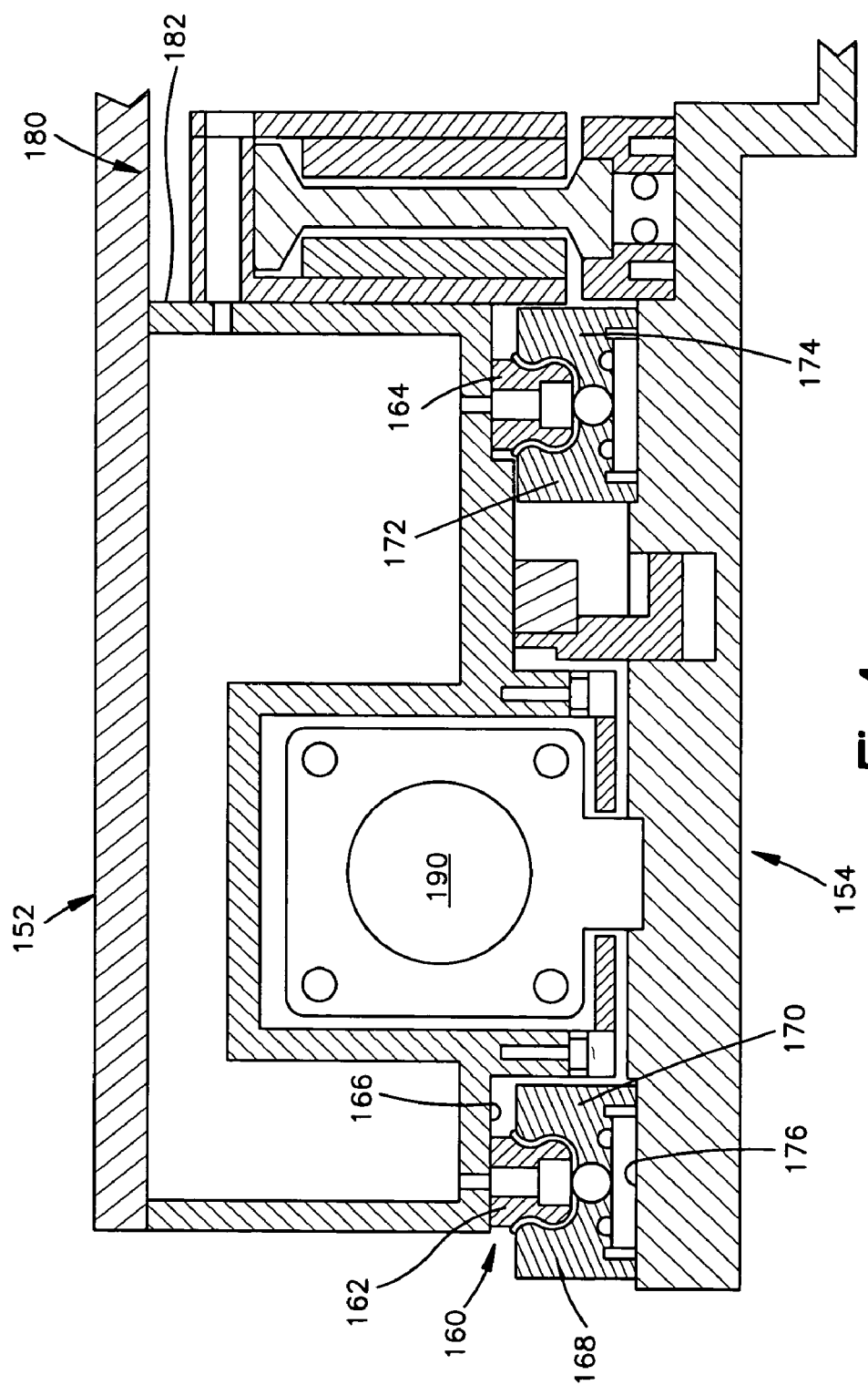
FIG. 4 is a section view showing a linear bearing and motor for moving the workpiece support along a linear travel path while ions that have been shaped into an ion beam strike the workpiece.

Linear motion of the carriage 154 with respect to the support frame 152 in FIGS. 3 and 4, is achieved by a linear motor assembly including a linear servomotor 180 disposed between an inwardly facing stepped portion 182 of the carriage 154 and the support frame 152. Additional details concerning the motor 190 are disclosed in the aforementioned '894 patent. A motor such as the motor 190 is used on prior art ion implanters and it is known to those skilled in the art the manner and size of signals that must be output from the control electronics to energize the motor to achieve both speed control and direction control for the so called slow scan movement.

FIG. 11 depicts optional structure for selectively applying a twist to the wafer 24 on the chuck. In this depiction a shaft 220 mounted within bearings 221 is coupled to a pulley 222 which rotates in response to a rotational output from a shaft 224 of the motor 105 which rotates a pulley 226 and moves a belt 230. The motor can rotate the wafer 24 approximately one full rotation. The region of the belt 330 and pulleys is at atmosphere and the shaft 220 passes through a seal to the evacuated region inside the chamber 50.

As the ions move from the source to the ion implantation chamber, they are scanned in a controlled manner by the scanning electrodes 30 under the control of the control electronics 26. This controlled deflection of ions produces a side to side scanning of ions emitting by the source to provide a thin beam of ions moving into the implantation chamber. Upon reaching the ion implantation chamber the ions strike a workpiece, typically a wafer on the workpiece support that is movably positioned within the implantation chamber. Simultaneous with the scanning provided by the electrodes 30, the control electronics moves the workpiece support assembly 200 up and down through the thin beam of ions to effect controlled beam processing of the workpiece.

The control electronics 26 includes a first control output 26a coupled to the scanning electrodes 30 to limit an extent of side to side scanning of the ion beam to less than a maximum amount. Turning to FIG. 6, this aspect of the invention can be used to limit ion processing of the workpiece to a specified sub region, for example, the left half, quadrants A and C of the workpiece 24. A second control output 26b coupled to the drive motor 190 co-ordinates back and forth movement of the workpiece as side to side scanning of the beam is controlled to cause the ion beam to impact a specified sub region on the workpiece 24. As an example, FIG. 7 shows a sub region 210 in quadrant A implanted by the ion beam 42. This region of implant is achieved by limiting both scanning of the ions that make up the beam and mechanical slow scan movement. A similar implant can be achieved in quadrant with the exact same scan pattern (perhaps with different energy) by making use of the twist capability of the implanter. Alternately, without using the twist, a similar region in quadrant B can be implanted by adjusting the scan voltage while maintaining the slow scan movement.

The system can implant different doses in each quadrant by implanting each half of the wafer (A+B and C+D) with different doses in the slow scan direction, scanning full width horizontally. By then twisting the workpiece wafer 90 degrees about an axis 107 normal to the center of the wafer, it can superimpose two more doses to the new top and bottom half (A+C and B+D). The accumulated dose in each quadrant is different for these combined implants.

The limiting of the scan dimension (in geometric terms limiting the start and end points of the x scan direction) is implemented in conjunction with controlling process parameters to assure acceptable dose and uniformity of the implant within a specified sub-region of an implant area of the workpiece.

An alternate approach for enabling multiple implants on a single wafer consists of implementing a selectable slow scan speed velocity profile. Slow scan in this instance refers to the motor drive movement of the support structure 100 up and down. The dose implanted monotonically increases from one end of the slow scan direction to the other according to selectable specified dose limits which form a part of the implant recipe. This is achieved by varying the scan speed of the motor 190. To increase the dose, the scan speed is slowed (allowing more time for a portion of the wafer to pass through the beam) and to decrease the dose the scan speed is increased.

Additionally, one could hold the beam at the end of each fast scan a small time increment, which increment decreases as the wafer scans at a linear velocity in the slow scan direction. This presumes that the wafer does not move far between each fast scan sweep compared to the height of the beam even with the additional time increments. That is easily achieved in systems such as presently in use where the fast, horizontal scan frequency is about 1000 Hz while the mechanical, vertical scan frequency is of the order of 1 Hz. The dose would again increase monotonically or by another preprogrammed pattern based on the spacing or delays imposed between the generally horizontal fast scan sweeps.

The continuously varied dose from the implants described above would allow one to select the dose that yields optimum device performance more accurately than can be done with a few discrete dose increments as is currently practiced in the art. To perform such evaluations a mask is used to create semiconductor devices at different regions of the workpiece. One could test performance of the completed device after doses of different strength are implanted onto the workpiece and just which dose gives the best or optimum performance. As a straightforward example, different doses could be implanted to each quadrant and fabricated devices in each quadrant then evaluated for their performance.

Selection of Start and End Points for Slow and Fast Scan Directions.

Figure 9:
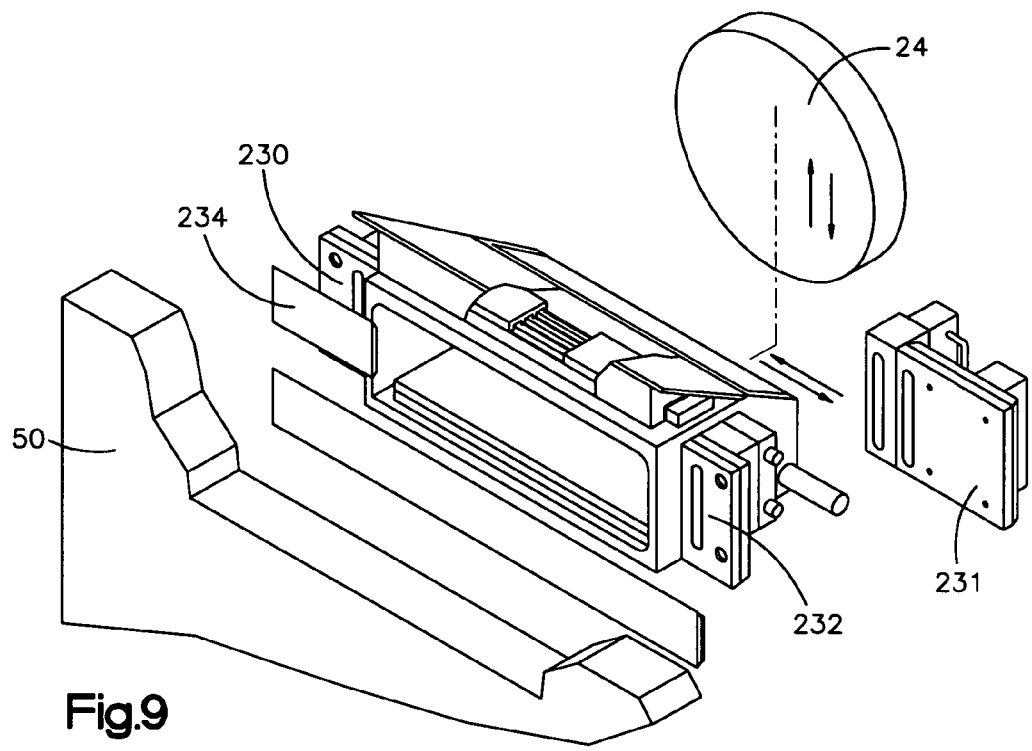
FIG. 9 is a perspective view of two dosimetry cups mounted for monitoring ion beam dose.

The system tunes the beam and generates uniform flux by modifying the scan waveform with "correction factors". The waveform applied to the scan electrodes is truncated to consist of just the portion from center to left (or right) side of the scan pattern. Dose is monitored by one of two dose cups 230, 232 on an appropriate side. FIG. 9 shows the dose monitoring equipment located in the end station just in front of the wafer 24 and consisting of two small cups 230, 232 on each side of the scanned beam 42 to monitor overscan current during the implant. An energy shield 234 is inserted into the beam 42 from the side to block off a portion (top to bottom) of the beam to control the energy of the implant.

Cup calibration is done for each of the cups 230, 232 on the left and right sides of the wafer independently while scanning the full width instead of summing the amplitudes as is presently done on prior art implanters. The flux measured by one cup would roughly double, since the scanned area is reduced by half, so the implant time would be reduced compared to implanting the whole wafer. Dose calculation would follow the normal routine based on the flux measured by a single dose cup. The control electronics software has a field in the recipe to specify an implant on just the left or just the right side of the wafer.

Slow Scan Direction

The motor 190 causes the workpiece to scan from one end of the scan until the beam reaches the center of the wafer, and then reverses direction. The region of non-uniform dose would depend on beam height and distance required to stop scanning in one direction and energize the motor 190 to move the workpiece at the desired scan speed in the opposite direction. Both dose cups are used and the implant takes the same number of slow scans as required for the whole wafer, at the same nominal slow scan velocity. Software executing in the programmable controller of the control electronics 26 includes a field in the recipe to specify an implant into just the top or just the bottom half of the wafer.

Selectable Dose Profile

Use Fast Scanner to Control Profile:

If the nominal fast scan frequency is 1000 Hz, then each stripe across the wafer is spaced at 500 usec intervals. A delay of 500 microseconds at each end of the scan would reduce the dose by a factor of two if the slow scan velocity is unchanged. This would still allow for closely spaced scans so there is not a risk of striping. One exemplary recipe operates open loop at a constant Y-scan velocity as the delay at each end of scan increases from 0 to 500 microseconds linearly across the wafer. The dose then changes linearly from the nominal dose to one half the nominal from top to bottom. Non-linear dose distribution functions are also produced.

Use Slow Scan Velocity to Control Profile:

The process of implant setup calculates a nominal slow scan velocity and the total number of scans required to achieve the specified dose. Software can be used to vary the speed of the motor 190 to set a scan velocity at the middle of the wafer to a nominal value and let the values at the top and bottom be the nominal value +X % at the top and −X % at the bottom. This would give a linear dose variation of 2X % across the wafer. Again the implant could run open loop with this slow scan velocity profile. Alternatively, one could specify a dose profile in the recipe and the mechanical or slow scan velocity changes as a function of Y-position to achieve that dose profile while using the dose cup current as a closed loop control.

Chaining Multiple Implants

The implants discussed above allow various parts of the wafer to receive a different dose, implant angle, energy, or species. In the case where dose or angle is the only difference between scans, it is efficient to chain the recipes so that the various segments of the wafer can be implanted without removing the wafer from the wafer chuck 102. For a species or energy change it may not be efficient to retune the beam if the same series of implants are done on many wafers. Energy changes can be implemented by changing a position of an energy shield 234 and species changes are made by substitution of different source materials. In these, instances it may be more efficient to process the whole batch of wafers and then change the species or energy of the implant.

Figure 8:
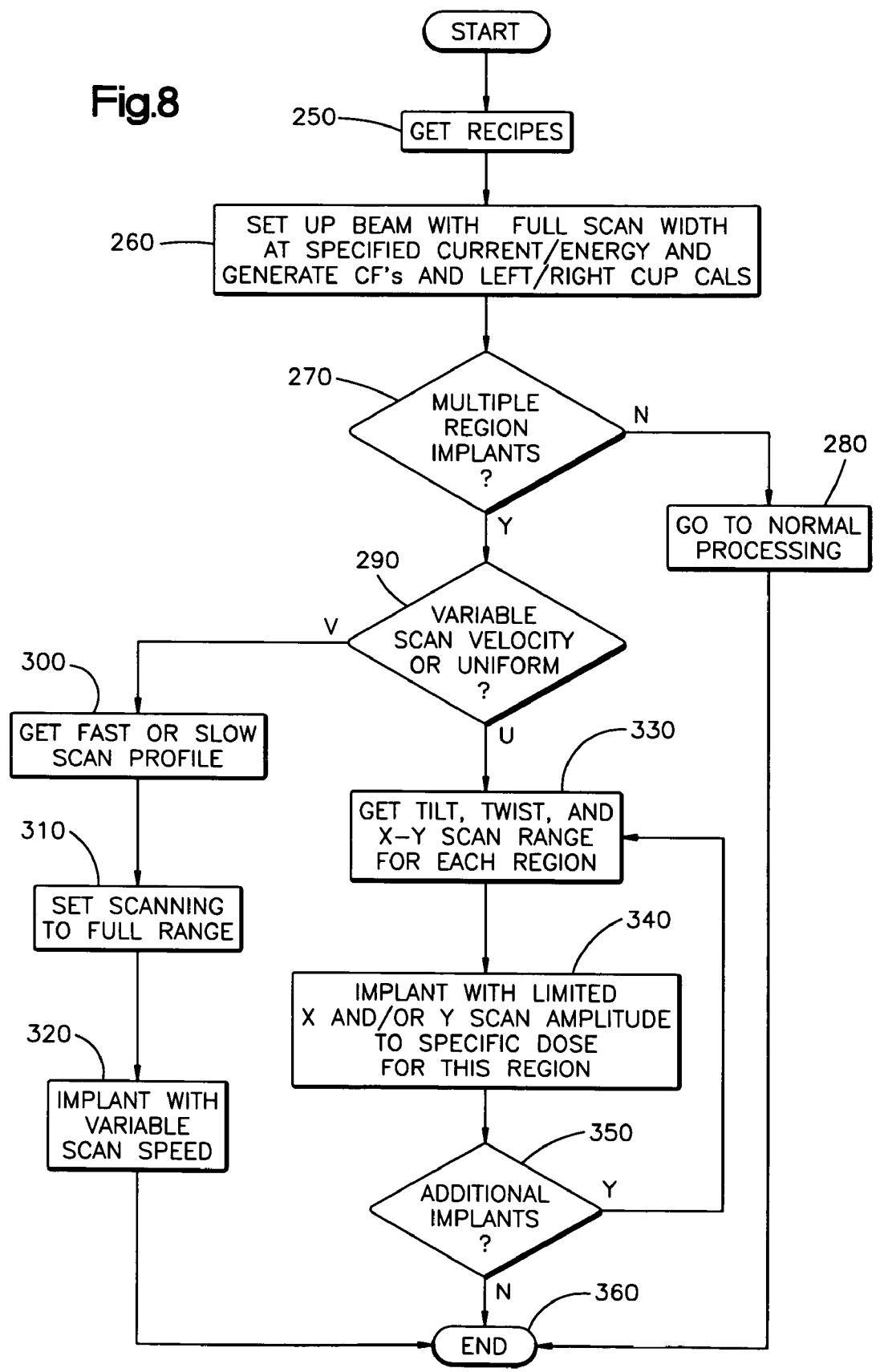
FIG. 8 is a flow chart of a scheme for controlling implantation to a portion of the wafer of FIGS. 6 and 7.

FIG. 8 is a flowchart of a method of for controlling workpiece implantation in accordance with the exemplary embodiment of the invention. The method is initiated 250 by control electronics 26, typically in the form of a programmable controller getting a recipe or recipes for implanting one or more workpieces. The ion beam is set up or calibrated 260 to create ions of a specified current and energy for movement along an initial trajectory. The flux density across the ribbon is made uniform by an iterative process of monitoring beam dose at the plane of the wafer using a moving faraday profiler 231 and modifying the scan waveform electronics with "correction factors." The two faraday cups 230, 232 are used to monitor beam current during the implant. The recipes will indicate if normal (uniform whole wafer) implanting is performed or if multiple regions are implanted differently. At a decision 270 the method determines if normal processing is performed and if so that processing 280 occurs and the method ends 360.

If different regions are implanted with different doses a decision is made 290 whether the implantation will be variable or uniform. If variable, a scan profile of the back and forth workpiece movment is set up 300 and the side to side scanning is set 310 to full range scanning. Finally the implantation is performed 320.

If uniform scanning is chosen the control electronics sets 330 the tilt, twist and scan ranges in the x and y directions for each of the multiple regions. The implantation 340 then occurs and a determination is made 350 whether additional implants into a next subsequent of the multiple implants are to be made. If so, the implant parameters are adjusted, and if not the process ends 360.

The present invention has been described with a degree of particularity. It is the intent, however, that the invention include all modifications and alterations from the disclosed design falling within the spirit or scope of the appended claims.

What is claimed is:

1. For use with an ion implanter having an ion source and an implantation chamber; apparatus comprising:
    a) beam forming structure that scans ions from side to side to produce a thin ion beam moving into an ion implantation chamber;
    b) a workpiece support for positioning a workpiece within the implantation chamber;
    c) a drive for moving the workpiece support back and forth through the thin ion beam to effect controlled ion beam processing of said workpiece; and
    d) a control including:
        i) a first control output coupled to the beam forming structure that limits an extent of side to side scanning to reduce a width of the ion beam to a width less than a width of the workpiece thereby limiting ion beam processing of the workpiece to a specified region of the workpiece; and
        ii) a second control output coupled to the drive to control back and forth movement of the workpiece to a specified amount; said first and second control outputs causing the ion beam to impact less than an entire surface of the workpiece.

2. The apparatus of claim 1 wherein the second control output from said control causes the drive to move the support back and forth at a non uniform rate.

3. The apparatus of claim 1 wherein the workpiece is a generally circular workpiece and wherein the control limits a width of the ion beam to intercept approximately one half of the workpiece and further limits back and forth movement of the support to cause said beam to implant ions into a selected single quadrant of said generally circular workpiece during a scan cycle.

4. The apparatus of claim 3 wherein the control performs additional scan cycles for ion beam processing other quadrants of said workpiece.

5. The apparatus of claim 4 wherein a dose is adjusted to have different values in different quadrants of said wafer.

6. The apparatus of claim 5 wherein the dose is controlled by adjusting a back and forth workpiece speed.

7. The apparatus of claim 1 additionally comprising two current sensors spaced on opposite sides of said workpiece support for monitoring current passing through the implantation chamber in the region of the workpiece.

8. The apparatus of claim 1 additionally comprising a tilt drive for adjusting an angle at which the ions that make up the beam strike a workpiece treatment surface.

9. The apparatus of claim 1 additionally comprising a twist drive for rotating the workpiece about an axis to perform treatment of a specified portion of the workpiece.

10. For use with an ion implanter having a source and an implantation chamber; apparatus comprising:
    a) structure including one or more scan electrodes that produces a thin beam of ions moving into an ion implantation chamber by deflecting ions in a scanning side to side deflection pattern;
    b) a workpiece support for positioning a workpiece within the implantation chamber;
    c) a drive for moving the workpiece support back and forth through the thin beam of ions to effect controlled beam processing of said workpiece; and
    d) a control including a control output coupled to the scan electrodes to vary a dose received by the workpiece by changing a delay period at ends of the back and forth deflection pattern during movement of the workpiece through the thin beam of ions.

11. The apparatus of claim 10 wherein the control causes the drive to move the support back and forth at a non uniform rate.

12. The apparatus of claim 10 additionally comprising two current sensors spaced on opposite sides of said workpiece support for monitoring current passing through the implantation chamber in the region of the workpiece.

13. For use with an ion implanter having an ion source and an implantation chamber; apparatus comprising:
    a) beam forming structure that produces a thin ion beam moving into an ion implantation chamber;
    b) a workpiece support for positioning a workpiece within the implantation chamber;

c) a drive for moving the workpiece support back and forth through the thin ion beam to effect controlled beam treatment of said workpiece; and
d) a control including:
 i) a first control output coupled to the beam forming structure that limits a width of the ion beam to less than a maximum amount and thereby limits ion processing of the workpiece to a specified region of the workpiece; and
 ii) a second control output coupled to the drive to control back and forth movement of the workpiece support to a specified amount so that a controlled portion of said workpiece having a width less than an entire width of the workpiece is treated by the thin beam of ions during the back and forth movement of the workpiece.

* * * * *